United States Patent [19]

Kamijo et al.

[11] Patent Number: 4,653,186

[45] Date of Patent: Mar. 31, 1987

[54] METHOD OF MANUFACTURING FILM-COVERED TERMINAL

[75] Inventors: Yoshimi Kamijo; Yoshinori Kato; Masami Ikarashi, all of Furukawa, Japan

[73] Assignee: Alps Electric Co., Ltd., Japan

[21] Appl. No.: 756,328

[22] Filed: Jul. 18, 1985

[30] Foreign Application Priority Data

Jul. 19, 1984 [JP] Japan .................. 59-150082

[51] Int. Cl.$^4$ ............................................. H05K 3/30
[52] U.S. Cl. ........................................ 29/838; 29/876;
174/68.5; 339/DIG. 3
[58] Field of Search .................. 29/876, 839, 845;
339/DIG. 3, 59 M; 228/139; 179/68.5

[56] References Cited

U.S. PATENT DOCUMENTS

| | | | |
|---|---|---|---|
| 3,346,689 | 10/1967 | Parstorfer | 174/68.5 |
| 3,818,279 | 6/1974 | Seeger, Jr. et al. | 174/68.5 X |
| 3,971,610 | 7/1976 | Buchoff et al. | 339/DIG. 3 X |
| 4,050,756 | 9/1977 | Moore | 29/845 X |
| 4,064,623 | 12/1977 | Moore | 29/876 |
| 4,118,092 | 10/1978 | Sado et al. | 339/DIG. 3 X |
| 4,240,198 | 12/1980 | Alonso | 29/876 |
| 4,449,774 | 5/1984 | Tarasai et al. | 339/DIG. 3 X |

Primary Examiner—Howard N. Goldberg
Assistant Examiner—Carl J. Arbes
Attorney, Agent, or Firm—Guy W. Shoup

[57] ABSTRACT

Disclosed is a film-covered terminal which comprises a foil-like or plate-like electrode terminal with its opposite surfaces covered with sealing films through bonding layers respectively, a rivet of a conductive plastic material inserted through the electrode terminal, the bonding layers, and the sealing films, and welded to the electrode terminal, the bonding layers, and the sealing films, and a soldering member secured to an end portion of the rivet. A method of manufacturing a film-covered terminal is also disclosed which comprises the steps of covering opposite surfaces of a foil-like and plate-like electrode terminal through bonding layers respectively, inserting a rivet of an electrically conductive plastic material into a through hole formed through the electrode terminal, the bonding layers, and the sealing films, the rivet having an end portion at which a soldering member is secured, and thermally press-bonding the opposite ends of the rivet.

10 Claims, 8 Drawing Figures

METHOD OF MANUFACTURING FILM-COVERED TERMINAL

BACKGROUND OF THE INVENTION

1. Field of the Invention

The present invention generally relates to a film-covered terminal and a method of manufacturing therefor, and more particularly to a film-covered terminal in which a foil or plate-like electrode terminal is sealed with sealing films.

2. Description of the Prior Art

Referring to FIG. 2(a) of the drawings, in the conventional film-covered terminal, the opposite surface of a foil or plate like electrode terminal 11 are respectively covered with sealing films 13 and 13' each composed of polyester, or the like, through bonding layers 12 and 12' each composed of a thermoplastic resin material, such as polyethylene, or the like. In this case, an end portion of the electrode terminal 11 is extended outward from the sealing films 13 and 13' so that it is soldered to an external circuit. In manufacturing such a film-covered terminal, the bonding layers 12 and 12' are laminated in advance on the respective surfaces of the sealing films 13 and 13', the electrode terminal 11 is sandwiched between the sealing films 13 and 13' with the respective bonding layers 12 and 12' disposed inside, and then the sealing films 13 and 13' are pressed against the electrode terminal 11 at about 120° C. whereby the bonding layers 12 and 12' are melted so as to perform bonding seal between the electrode terminal 11 and each of the sealing films 12 and 12'.

As shown in FIG. 2(b), however, there has been disadvantages in the conventional film-covered terminal that the sealing films 13 and 13' are apt to be separated from the electrode terminal 11 together with the bonding layers 12 and 12' and moisture is apt to enter the boundary surfaces a and a' between the electrode terminal 11 and the respective bonding layers 12 and 12', or the like.

To improve the above-mentioned disadvantage, is a film-covered terminal in which a hot-melting agent of proper adhesion is coated over the respective surfaces of the electrode terminal 11 and the bonding layers 12 and 12' at the boundary surfaces a and a'. Even in this case, however, there is a further disadvantage that if external force is exerted onto a portion of the terminal, the adhesion of the bonding layers 12 and 12' is deteriorated, so that moisture may occasionally enter gaps between the electrode terminal 11 and the bonding layers 12 and 12'.

SUMMARY OF THE INVENTION

An object of the present invention is to provide a film-covered terminal and a method of manufacturing therefor, in which sealing films and bonding layers are not apt to be separated from an electrode terminal and moisture is prevented from entering the film-covered terminal.

According to one aspect of the present invention, the film-covered terminal comprises a foil-like or plate-like electrode terminal with its opposite surfaces covered with sealing films through bonding layers respectively, a rivet of a conductive plastic material inserted through the electrode terminal, the bonding layers, and the sealing films, and welded to the electrode terminal, the bonding layers, and the sealing films, and a soldering member secured to an end portion of the rivet.

According to another aspect of the present invention, the method of manufacturing a film-covered terminal which comprises the steps of covering opposite surfaces of a foil-like and platelike electrode terminal through bonding layers respectively, inserting a rivet of an electrically conductive plastic material into a through hole formed through the electrode terminal, the bonding layers, and the sealing films, the rivet having an end portion at which a soldering member is secured, and thermally press-bonding the opposite ends of the rivet.

Therefore, according to the present invention, the electrode terminal is entirely embedded in the sealing films and the electrode terminal is electrically connected to an external circuit through a conductive rivet, so that the adhesion of a sealing portion becomes securer and moisture can be prevented from entering the structure.

BRIEF DESCRIPTION OF THE DRAWINGS

FIGS. 1(a) to 1(f) are diagrams illustrating an embodiment of the present invention, in which:

FIG. 1(a) is a sectional view showing the state in which an electrode terminal is covered with bonding layers and sealing films;

FIG. 1(b) is a plan view of the same;

FIG. 1(c) is a sectional view of a rivet;

FIG. 1(d) is a sectional view showing the state in which the rivet is inserted through and thermally press-bonded;

FIG. 1(e) is a sectional view of the film-covered terminal which has been manufactured;

FIG. 1(f) is a sectional view showing the state in which an external terminal is soldered;

FIGS. 2(a) and 2(b) are diagrams showing a conventional film-covered terminal, in which:

FIG. 2(a) is a sectional view of the same; and

FIG. 2(b) is a sectional view showing the state in which bonding layers and sealing films are separated from an electrode terminal.

DESCRIPTION OF PREFERRED EMBODIMENT

Figure 1A:
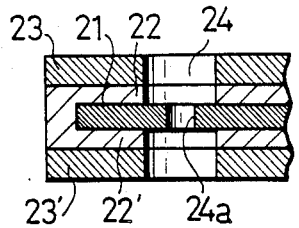

Referring to the drawings, an embodiment of the present invention will be described hereunder.

Figure 1B:
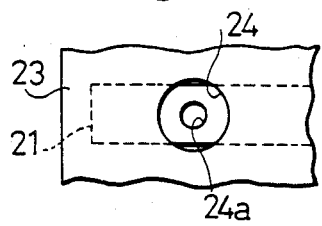

As shown in FIGS. 1(a) and 1(b), the opposite surfaces of an electrode terminal 21 are covered with sealing films 23 and 23' through bonding layers 22 and 22' respectively. That is, the bonding layers 22 and 22' formed in the form of film have been laminated in advance on the respective surfaces of the sealing films 23 and 23', the electrode terminal 21 is sandwiched between the sealing film 23 and 23' with the bonding layers 22 and 21' inside, and then the sealing films 23 and 23' are thermopressed against the electrode terminal 21 whereby the bonding layers 22 and 22' are melted so as to perform bonding seal between the electrode terminal 21 and each of the sealing films 22 and 22'. In this case, through holes have been respectively formed through the electrode terminal 21, the bonding layer 22 and 22', and the sealing films 23 and 23', and in bonding the layers, the through holes are registered to constitute a through hole 24.

The diameter of the through hole formed in the electrode terminal 21 is made slightly smaller than that of each of the other through holes so that the through hole 24 is narrowed at its intermediate portion 24a.

For example, a metal foil or plate of copper, or the like, may be used as a material for the electrode terminal 21. Alternatively, as a material for the electrode terminal 21, it is possible to use an electrically conductive resin sheet or film in which electrically conductive powder, such as carbon powder, silver powder, nickel powder, copper powder, or the like, is mixed with a thermo-setting resin material of such as epoxide group, phenol group, polyester group, or the like, or a thermoplastic resin material, such as polyethylene, polystyrene, polyamide, polyvinyl alcohol, polypropylene, or the like. A thermoplastic resin material, such as polyethylene, or the like, is used as a material for the bonding layers 22 and 22'. A film having a low coefficient of water absorption, such as polyester, trifluoro ethylene, polyvinyl chloride, polyvinylidene chloride, polycarbonate, or the like, is used for the sealing films 23 and 23'.

Figure 1D:
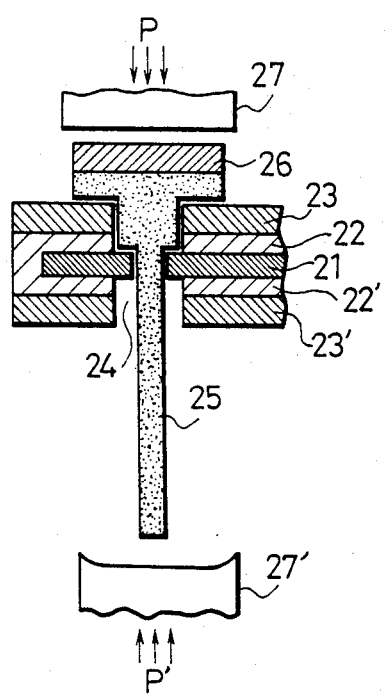
Figure 1C:
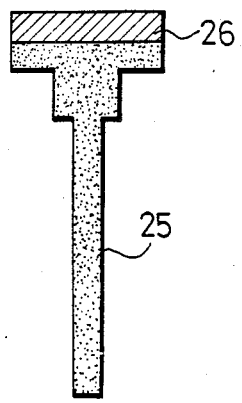

An electrically conductive rivet 25 as shown in FIG. 1(c) is inserted through the through hole 24. A material in which an electrically conductive powder, such as carbon powder, silver powder, nickel powder, copper powder, or the like, is mixed with a resin material, such as polyethylene, polystyrene, epoxide resin, polyvinyl chloride, or the like, may be used for the rivet 25. A soldering member 26 constituted by a metal plate such as a copper plate plated with tin, or the like, is attached on the head portion of the rivet 25.

Figure 1E:
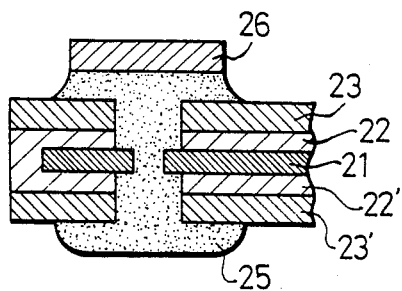

As shown in FIG. 1(d), the rivet 25 is heated and pressed from upper and lower sides thereof by thermal presses 27 and 27'. Thus, the rivet 25 is melted, and adhesively closely bonded to the electrode terminal 21, the bonding layers 22 and 22', and the sealing films 23 and 23', at the inside peripheral portions of and the periphery of the opening portions of the through hole 24. The thus bonded state is shown in FIG. 1(e). Accordingly, the electrode terminal 21 is entirely embedded in the bonding layers 22 and 22' and the sealing films 23 and 23', and the electrode terminal 21 is electrically connected to an external circuit through the rivet 25.

Figure 1F:
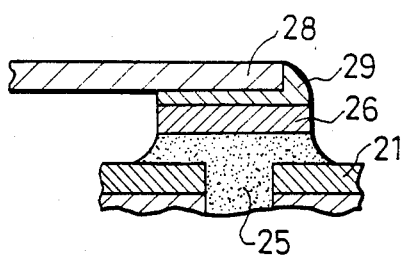
Figure 2A:
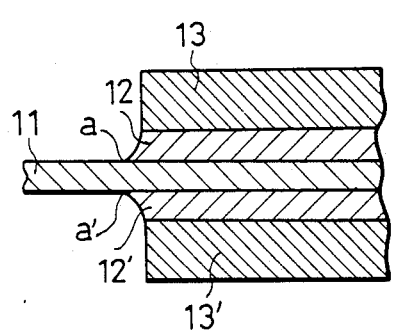
Figure 2B:
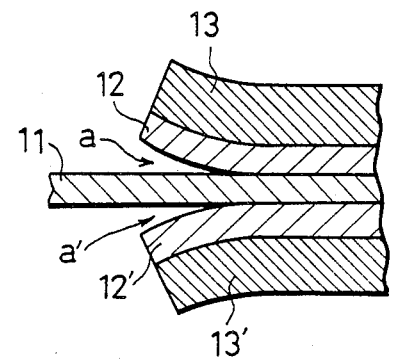

As shown in FIG. 1(f), an external terminal 28 is soldered to the soldering member 26 through a soldering layer 29. Thus, the electrode terminal 21 is electrically connected to the external terminal 28 through the rivet 25, the soldering member 26, and the soldering layer 29.

Further, in the state as shown in FIGS. 1(a) and (b), if the periphery of the opening portions of the through hole 24 and the rivet are irradiated with ultraviolet rays so as to activate the molecules of the sealing films 23 and 23', the adhesion can be improved when the rivet 25 is inserted and thermo-pressed, resulting in improvement in air-tightness.

EMBODIMENT 1

A film-covered terminal was produced by using a copper foil as a material for an electrode terminal 21, a polyethylene film of a thickness of about 0.06–0.1 mm for bonding layers 22 and 22', and a polyester film of a thickness of about 0.2–0.5 mm for sealing films 23 and 23'. The bonding layers 22 and 22' had been laminated in advance on the sealing films 23 and 23' respectively and then a through hole having a diameter of 3 mm had been also formed in each of the laminated layers 23, 22 and 23', 22'. A through hole having a diameter of 2 mm had been formed in advance in the electrode terminal 21. The electrode terminal 21 was sandwiched between the sealing films 23 and 23' with the bonding layers 22 and 22' laminated thereon respectively, and all the layers were thermally press-bonded to form an intergral assembly. At this time, the through hole formed in the electrode terminal 21 and the respective through holes formed in bonding layers 22 and 22' and the sealing films 23 and 23' were registered to each other to form a general through hole 24. A mixture of polyethylene and carbon powder was used as a material for a rivet 25 and a soldering member 26 composed of a copper plate plated with tin was secured to the head portion of the rivet 25. Then the rivet 25 was inserted through the through hole 24 and the rivet 25 was thermally press-bonded from its opposite ends at 120°–150° C. for five minutes by thermal presses 27 and 27', so that the rivet 25 was melted and bonded to the assembled layers. In the thus manufactured film-covered terminal, both the rivet 25 and the bonding layers 22 and 22' were composed of the same material (that is polyethylene) so that they were melted and mixed together to obtain proper adhesion. As a result, a film-covered terminal could be obtained in which the sealing films 23 and 23' were not apt to be separated from the electrode terminal 21 and which had a proper property of air-tightness.

EMBODIMENT 2

A film-covered terminal was manufactured in the same manner as in the Embodiment 1 except that ultraviolet rays were irradiated onto the periphery of opening portions of the through hole 24 when the rivet was inserted into the through hole 24. In this film-covered terminal, the adhesion between the rivet 25 and the sealing films 23 and 23' was made securer.

EMBODIMENT 3

A film-covered terminal was manufactured in the same manner as in the Embodiment 1 except that a mixture of an epoxide resin material and carbon powder was used as a material for the rivet 25 thermally press-bonding was made under the condition of 120°–150° C. for twenty minutes. As a result, a film-covered terminal having a property of proper adhesion could be obtained.

EMBODIMENT 4

A film-covered terminal was manufactured in the same manner as in the Embodiment 1 except that a mixture of polyvinyl chloride and carbon powder was used as a material for the rivet 25 and thermally press-bonding was performed under the condition of 100°–160° C. for five minutes. As a result, a film-covered terminal having a property of proper adhesion could be obtained.

EMBODIMENT 5

A film-covered terminal was manufactured in the the same manner as in the Embodiment 1 except that a mixture of polyvinylidene chloride and carbon powder was used as a material for the rivet 25 and thermally press-bonding was effected under the condition of 130°–150° C. for five minutes. As a result, a film-covered terminal having a property of proper adhesion could be obtained.

EMBODIMENT 6

A film-covered terminal was manufactured by the same method as in the Embodiment 1 except that a conductive plastic sheet composed of a mixture of epoxide resin and carbon powder was used as a material for the electrode terminal 21. As a result, a film-covered terminal having a property of proper adhesion among the respective layers

EMBODIMENT 7

A film-covered terminal was manufactured by the same method as in the Embodiment 1 except that a conductive plastic sheet composed of a mixture of polyethylene and carbon powder was used as a material for the electrode terminal 21. As a result, a film-covered terminal having a property of proper adhesion among the respective layers.

EMBODIMENT 8

A film-covered terminal was manufactured in the same manner as in the Embodiment 1, except that a trifluoro ethylene resin material is used as a material for the sealing films 23 and 23'. As a result, a film-covered terminal having a property of proper adhesion among the respective layers.

As described above, according to the present invention, an electrode terminal is entirely embedded in bonding layers and sealing films, and the electrode terminal is electrically conducted to an external circuit through a rivet, resulting in adhesion as well as airtightness between the respective layers to thereby obtain a film-covered terminal in which the bonding layers and the sealing films are not apt to be separated from the electrode terminal and moisture can hardly entered the film-covered terminal.

What is claimed is:

1. A method of manufacturing a film-covered terminal comprising the steps of:
   covering opposite surfaces of an electric terminal with sealing films through bonding layers respectively;
   inserting a rivet of an electrically conductive plastic material into a through hole formed through said electric terminal, said bonding layers, and said sealing films, said rivet having an external end portion to which a soldering member formed as a metallic plate is secured; and
   thermally press-bonding the opposite ends of said rivet such that the electrically conductive material thereof is thermally melted and securely bonded physically and electrically together with said bonding layers and said electric terminal.

2. A method of manufacturing a film-covered terminal according to claim 1, in which the steps further comprising the step of irradiating the periphery of opening portions of said through hole with ultraviolet rays before the step of inserting said rivet into said through hole.

3. A method of manufacturing a film-covered terminal according to claim 1, in which a copper film is used as a material for said electrode terminal, a polyethylene film is used as a material for said bonding layers, and a polyester film is used as a material for said sealing film.

4. A method of manufacturing a film-covered terminal according to claim 3, in which a mixture of polyethylene with carbon powder is used as a material for said rivet.

5. A method of manufacturing a film-covered terminal according to claim 3, in which a mixture of epoxide resin with carbon powder is used as a material for said rivet.

6. A method of manufacturing a film-covered terminal according to claim 3, in which a mixture of polyvinyl chloride with carbon powder is used as a material for said rivet.

7. A method of manufacturing a film-covered terminal according to claim 3, in which a mixture of polyvinylidene chloride with carbon powder is used as a material for said rivet.

8. A method of manufacturing a film-covered terminal according to claim 1, in which an electrically conductive plastic sheet made of a mixture of epoxide resin with carbon powder is used as a material for said electrode terminal, a polyethylene film is used as a material for said bonding layers, a polyester film is used as a material for said sealing film, and a mixture of polyethylene with carbon powder is used as a material for said rivet.

9. A method of manufacturing a film-covered terminal according to claim 1, in which an electrically conductive plastic sheet made of a mixture of polyethylene with carbon powder is used as a material for said electrode terminal, a polyethylene film is used as a material for said bonding layers, a polyester film is used as a material for said sealing film, and a mixture of polyethylene with carbon powder is used as a material for said rivet.

10. A method of manufacturing a film-covered terminal according to claim 1, in which a copper film is used as a material for said electrode terminal, a polyethylene film is used as a material for said bonding layers, a trifluoro ethylene resin is used as a material for said sealing film, and a mixture of polyethylene with carbon powder is used as a material for said rivet.

* * * * *